United States Patent
Chen et al.

(10) Patent No.: US 8,596,602 B2
(45) Date of Patent: Dec. 3, 2013

(54) DEVICE USING ELASTIC ELEMENT

(75) Inventors: Yong-Jian Chen, Guangdong (CN); Heng-Hsin Huang, Tu-Cheng (TW)

(73) Assignees: Premier Image Technology (China) Ltd., Foshan (CN); Hon Hai Precision Industry Co., Ltd., New Taipei (TW)

( * ) Notice: Subject to any disclaimer, the term of this patent is extended or adjusted under 35 U.S.C. 154(b) by 163 days.

(21) Appl. No.: 13/166,794

(22) Filed: Jun. 22, 2011

(65) Prior Publication Data

US 2012/0286127 A1 Nov. 15, 2012

(51) Int. Cl.
*F16M 13/00* (2006.01)

(52) U.S. Cl.
USPC .................. 248/594; 248/592; 248/292.13

(58) Field of Classification Search
USPC ............. 248/297.11, 297.21, 292.13, 295.11, 248/287.1, 298.1, 346.06, 564, 584, 591, 248/594, 595, 602, 620, 621, 655, 314, 248/346.04, 592; 74/110, 469
See application file for complete search history.

(56) References Cited

U.S. PATENT DOCUMENTS

| 6,288,891 B1 * | 9/2001 | Hasegawa et al. ....... 361/679.07 |
| 6,504,707 B2 * | 1/2003 | Agata et al. ............. 361/679.05 |
| 7,874,223 B2 * | 1/2011 | Sugar et al. ...................... 74/110 |
| 8,272,104 B2 * | 9/2012 | Chen et al. ........................ 16/354 |
| 2002/0179791 A1 * | 12/2002 | Kwon ......................... 248/284.1 |
| 2006/0213305 A1 | 9/2006 | Sugar et al. |

FOREIGN PATENT DOCUMENTS

| CN | 201258934 Y | 6/2011 |
| TW | 201013075 A | 4/2010 |

* cited by examiner

*Primary Examiner* — Terrell McKinnon
*Assistant Examiner* — Eret McNichols
(74) *Attorney, Agent, or Firm* — Altis & Wispro Law Group, Inc.

(57) ABSTRACT

A device includes a receiving container, an elastic element, and a loading block. The receiving container includes a first supporting surface, a second supporting surface, a fixing surface and a resisting surface. The first and second supporting surfaces perpendicularly connect to each other. The resisting surface connects to the first supporting surface. The fixing surface connects to the second supporting surface. The elastic element includes a first rail positioned on the first supporting surface, a second rail positioned on the second supporting surface, a first sliding block slidably positioned on the first rail, a second sliding block slidably positioned on the second rail, a spring connected between the fixing surface and the second sliding block, and a connecting pole connected between the first and second sliding blocks. The loading block is positioned on the first sliding block and faces the resisting surface.

1 Claim, 4 Drawing Sheets

DEVICE USING ELASTIC ELEMENT

BACKGROUND

1. Technical Field

The present disclosure relates to an elastic element and a device using same.

2. Description of Related Art

Springs are usually received in battery boxes to hold batteries. However, the elastic force of the spring is linear with the elastic deformation thereof. In other words, a larger deformation will result in a greater elastic force. When the battery is working, a number of elements in the battery produce heat, and thus the volume of the battery will become larger. As a result of increasing size, the increasing pressure from the spring may become large enough to damage or destroy the battery.

Therefore, it is desirable to provide an elastic element and a device using the same that can overcome the above-mentioned limitations.

BRIEF DESCRIPTION OF THE DRAWINGS

Many aspects of the embodiments should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Figure 1:
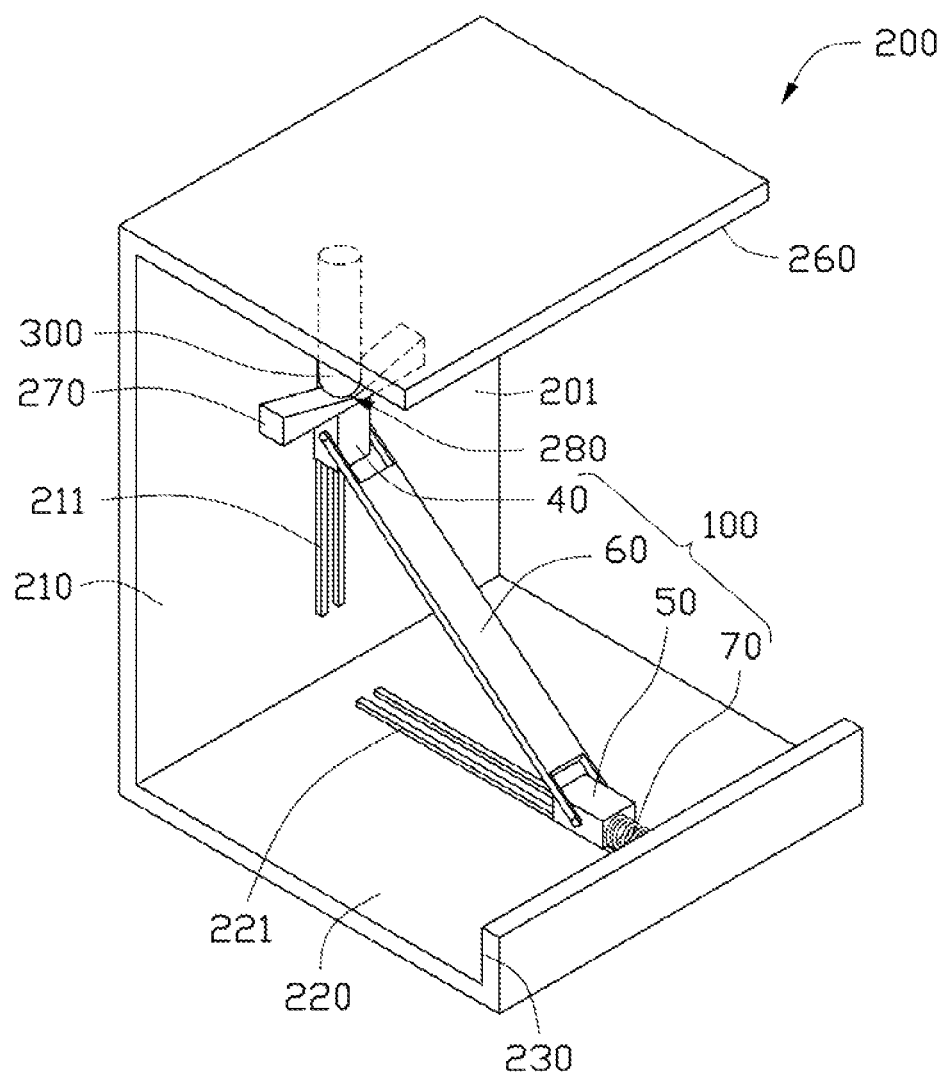
FIG. 1 is a schematic view of a device with an elastic element, according to an exemplary embodiment.
Figure 2:
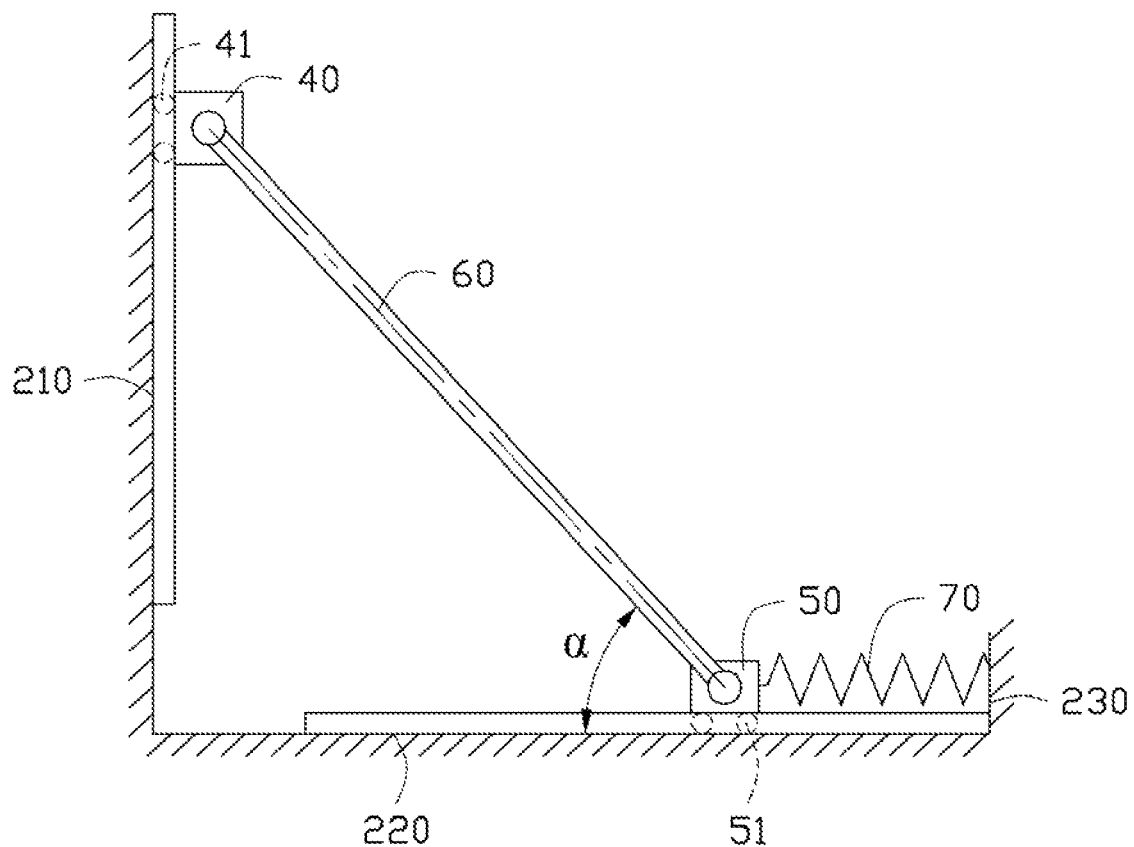
FIG. 2 is a schematic view of the elastic element of FIG. 1 in an original state.
Figure 3:
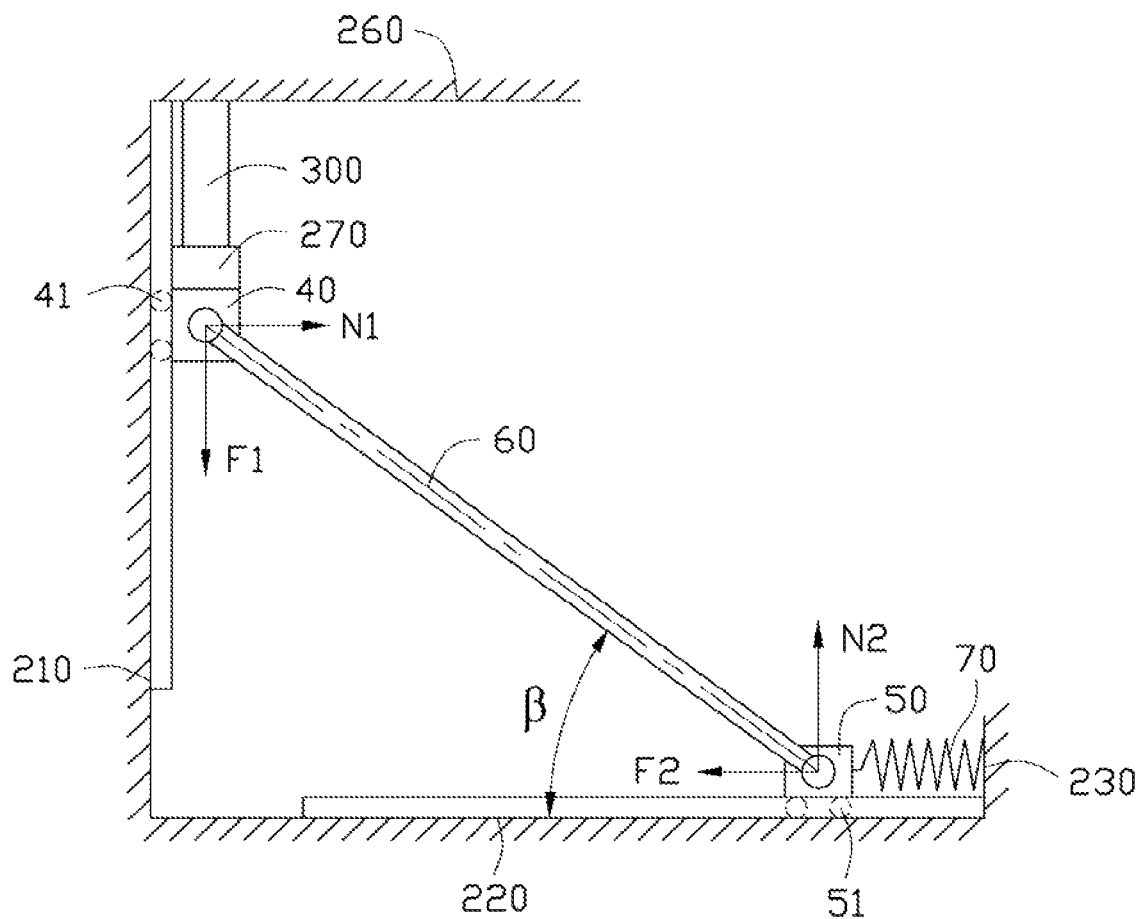
FIG. 3 is a schematic view of the elastic element of FIG. 1 in a working state.

Referring to FIGS. 1-3, a device 200 for holding an object 300, according to an embodiment, is shown. The device 200 includes a receiving container 201, a loading block 270, and an elastic element 100. The loading block 270 and the elastic element 100 are received in the receiving container 201. In this embodiment, the receiving container 201 is a battery box, the object 300 is a battery.

The receiving container 201 includes a first supporting surface 210, a second supporting surface 220, a fixing surface 230, and a resisting surface 260. The first supporting surface 210 is parallel to the fixing surface 230. The second supporting surface 220 is perpendicular to the first supporting surface 210 and the fixing surface 230 (overhanging the first supporting surface 210) is perpendicular to the second supporting surface 220. The resisting surface 260 opposes the second supporting surface 220. In this embodiment, the resisting surface 260 is parallel to the second supporting surface 220. In other embodiments, the resisting surface 260 can be other than parallel to the second supporting surface 220.

The elastic element 100 butts against the loading block 270, in which a V-shaped groove 280 (facing the resisting surface 260) is defined. The object 300 is clamped between the groove 280 and the resisting surface 260.

The elastic element 100 includes a first rail 211, a second rail 221, a first sliding block 40, a second sliding block 50, a connecting pole 60, and a spring 70.

The first rail 211 is positioned on the first supporting surface 210, the second rail 221 is positioned on the second supporting surface 220, and the two rails 211, 221 are in effective alignment.

The first sliding block 40 is slidably disposed on the first rail 211, the second sliding block 50 is slidably disposed on the second rail 221. The loading block 270 is positioned on the first sliding block 40. In moving away, or being moved away, from the resisting surface 260, the loading block 270 applies a force (pushing force F1) to the first sliding block 40 along the first rail 211. In this embodiment, the first sliding block 40 includes two first rollers 41. The two first rollers 41 engage with the first rail 211. The second sliding block 50 includes two second rollers 51. The two second rollers 51 engage with the second rail 221. The numbers of the first rollers 41 and the second rollers 51 are not limited in this embodiment.

The spring 70 is fixed between the fixing surface 230 and the second sliding block 50. Any deformation of the spring 70 is parallel to the second supporting surface 220.

One end of the connecting pole 60 is rotatably connected to the first sliding block 40, and the opposite end of the connecting pole 60 is rotatably connected to the second sliding block 50, forming an included angle between the connecting pole 60 and the second rail 221. In this embodiment, the ends of the connecting pole 60 articulate with the first sliding block 40 and the second sliding block 50.

Referring to FIG. 2, when the elastic element 100 is in an original state, the included angle between the connecting pole 60 and the second rail 221 is $\alpha$.

Referring to FIG. 3, the fixed length of the object 300 acts against the first pushing force F1 to deform the spring 70. The first sliding block 40 applies a reacting force F to the object 300 along the first rail 211. When the object 300 is unmoving or in uniform motion, the reacting force F is equal to the first pushing force F1, and the direction of the reacting force F is equal and opposite to that of the first pushing force F1. The first rail 211 applies a first supporting force N1 to the first sliding block 40, the spring 70 applies a second pushing force F2 to the second sliding block 50, the second rail 221 applies a second supporting force N2 to the second sliding block 50, at this time, the included angle is $\beta$. The displacement of the first sliding block 40 is distance S along the first rail 211. The length of the connecting pole 60 is L. The elastic coefficient of the spring 70 is K. When the frictional forces between the first rollers 41 and the first rail 211, between the second rollers 51 and the second rail 221 are omitted, the relationship between the forces is given by the following formula:

$$F = F1 = N2 = F2 \times \tan\beta = K \times L \times [\cos\beta - \cos\alpha] \times \tan\beta; \quad (1)$$

$$S = L \times [\sin\alpha - \sin\beta]. \quad (2)$$

Because L and K are constant, if K=10 gf/millimeter (gf/mm, 1 gf=0.01 newton), L=10 mm, $\alpha$=80° (degree), $\beta$ changes from 79° to 50°. The reacting force F and the displacement of the first sliding block 40 of this embodiment satisfy Table 1.

TABLE 1

| $\beta$ (degree) | S (mm) | F (gf) |
| --- | --- | --- |
| 79 | 0.031910991 | 8.790263498 |
| 78 | 0.066807901 | 16.05506484 |
| 77 | 0.104680885 | 22.13867474 |
| 76 | 0.14551842 | 27.28718681 |
| 75 | 0.189308078 | 31.68131198 |
| 74 | 0.236036534 | 35.45675531 |

TABLE 1-continued

| β (degree) | S (mm) | F (gf) |
|---|---|---|
| 73 | 0.285689568 | 38.71742016 |
| 72 | 0.338252071 | 41.54422213 |
| 71 | 0.393708048 | 44.00112632 |
| 70 | 0.452040625 | 46.13937747 |
| 69 | 0.513232049 | 48.00052419 |
| 68 | 0.577263701 | 49.61861996 |
| 67 | 0.644116095 | 51.02185121 |
| 66 | 0.713768889 | 52.23375907 |
| 65 | 0.786200887 | 53.27416842 |
| 64 | 0.861390048 | 54.15990293 |
| 63 | 0.939313492 | 54.90534143 |
| 62 | 1.019947506 | 55.52285527 |
| 61 | 1.103267554 | 56.02315529 |
| 60 | 1.189248281 | 56.41556951 |
| 59 | 1.277863524 | 56.70826709 |
| 58 | 1.369086315 | 56.90844044 |
| 57 | 1.462888897 | 57.02245413 |
| 56 | 1.559242726 | 57.05596763 |
| 55 | 1.658118479 | 57.01403701 |
| 54 | 1.759486071 | 56.90119964 |
| 53 | 1.863314653 | 56.72154524 |
| 52 | 1.969572632 | 56.47877564 |
| 51 | 2.078227673 | 56.17625539 |
| 50 | 2.189246711 | 55.81705477 |

The table 1 shows that when the included angle β changes from 79° to 65°, S is 0.78 mm, the reacting force F changes from 8.79 gf to 53.27 gf, when the included angle β changes from 64° to 50°, S is 1.4 mm, the reacting force F changes from 54.16 gf to 57.05 gf. So when the included angle β changes from 64° to 50°, the variation of S is 64% of the total variation thereof, the variation of the reacting force F is 6.6% of the total variation thereof.

Figure 4:
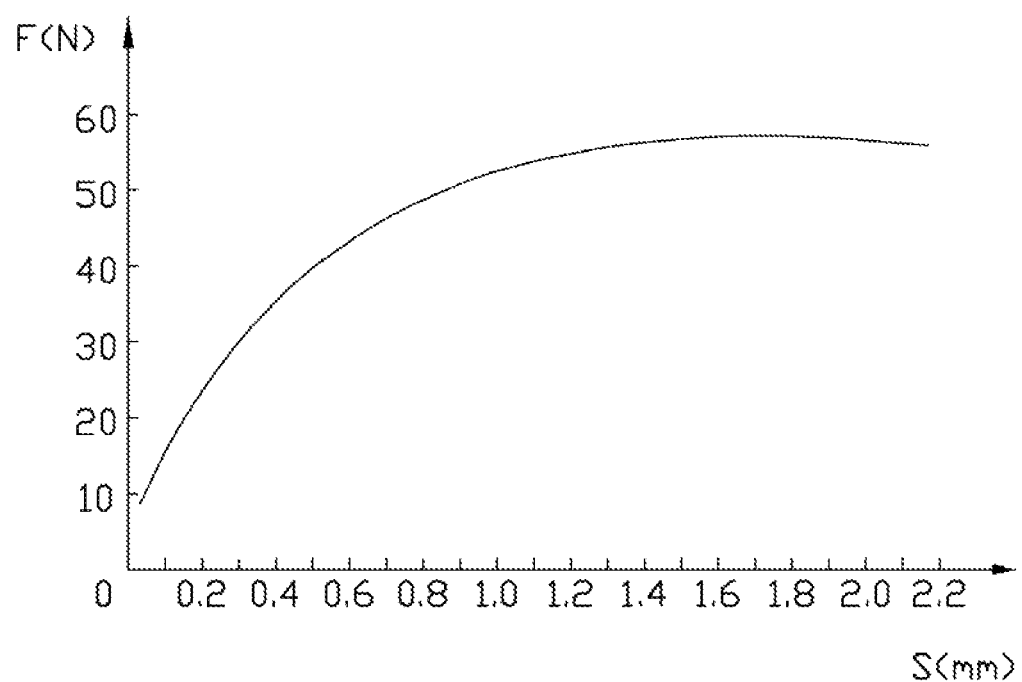
FIG. 4 is a graph showing the relationship of the elastic force to the displacement of the elastic element of FIG. 1.

As illustrated in FIG. 4, the reacting force F is not linear with S, the reacting force F experiences little change even when the variation in S is substantial.

In other embodiments, when a sudden or large force acts against the first sliding block 40, the elastic element 100 serves as a buffer or shock absorber.

In other embodiments, the first rollers 41 and the second rollers 51 also can be omitted. Accordingly, the width of the first rail 211 and the second rail 221 need to be broadened to respectively exactly receive the first sliding block 40 and the second sliding block 50. The surface of the first rail 211 contacting with the first sliding block 40, the first supporting surface 210 contacting with the first sliding block 40, the surface of the second rail 212 contacting with the second sliding block 50, the second supporting surface 220 contacting with the second sliding block 50 also can be smoothed to decrease friction between the first sliding block 40 and the first rail 211, between the first sliding block 40 and the first supporting surface 210, between the second sliding block 50 and the second rail 221, and between the second sliding block 50 and the second supporting surface 220.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A device comprising:
    a receiving container having a first supporting surface, a second supporting surface, a fixing surface and a resisting surface, the first and second supporting surfaces perpendicularly connecting to each other, the resisting surface connecting to the first supporting surface, the fixing surface connecting to the second supporting surface, wherein the receiving container is a battery box;
    an elastic element received in the receiving container and comprising:
        a first rail positioned on the first supporting surface and opposite to the fixing surface, the first rail arranged along a first extending direction;
        a second rail positioned on the second supporting surface and opposite to the resisting surface, the second rail arranged along a second extending direction, the second extending direction being intersected with the first extending direction;
        a first sliding block slidably positioned on the first rail;
        a second sliding block slidably positioned on the second rail;
        a spring, one end of the spring being fixed to the fixing surface, and the other end of the spring being fixed to the second sliding block; and
        a connecting pole, one end of the connecting pole being rotatably connected to the first sliding block, and the other end of the connecting pole being rotatably connected to the second sliding block; and
    a loading block positioned on the first sliding block and facing the resisting surface, the loading block defining an open groove facing the resisting surface, the open groove and the resisting surface being configured for cooperatively clamping an object therebetween.

* * * * *